(12) United States Patent
Hsu et al.

(10) Patent No.: US 11,830,800 B2
(45) Date of Patent: Nov. 28, 2023

(54) METALLIZATION STRUCTURE AND PACKAGE STRUCTURE

(71) Applicant: Taiwan Semiconductor Manufacturing Company, Ltd., Hsinchu (TW)

(72) Inventors: Chia-Kuei Hsu, Hsinchu (TW); Ming-Chih Yew, Hsinchu (TW); Shu-Shen Yeh, Taoyuan (TW); Po-Yao Lin, Hsinchu County (TW); Shin-Puu Jeng, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 211 days.

(21) Appl. No.: 17/344,982

(22) Filed: Jun. 11, 2021

(65) Prior Publication Data

US 2022/0310503 A1 Sep. 29, 2022

Related U.S. Application Data

(60) Provisional application No. 63/166,232, filed on Mar. 25, 2021.

(51) Int. Cl.
*H01L 23/48* (2006.01)
*H01L 23/498* (2006.01)
(Continued)

(52) U.S. Cl.
CPC .. *H01L 23/49838* (2013.01); *H01L 23/49816* (2013.01); *H01L 23/49822* (2013.01);
(Continued)

(58) Field of Classification Search
CPC ......... H01L 23/49816; H01L 23/49822; H01L 24/16
See application file for complete search history.

(56) References Cited

U.S. PATENT DOCUMENTS 8,047,421 B2 * 11/2011 Sri-Jayantha ..... H01L 23/49816
228/180.5
9,000,584 B2 4/2015 Lin et al.
(Continued)

FOREIGN PATENT DOCUMENTS

| TW | 201530708 | 8/2015 |
|---|---|---|
| TW | 201635451 | 10/2016 |
| TW | 201913939 | 4/2019 |

OTHER PUBLICATIONS

"Office Action of Taiwan Counterpart Application", dated Mar. 14, 2023, p. 1-p. 12.
(Continued)

*Primary Examiner* — Nicholas J Tobergte
(74) *Attorney, Agent, or Firm* — JCIPRNET

(57) ABSTRACT

A metallization structure electrically connected to a conductive bump is provided. The metallization structure includes an oblong-shaped or elliptical-shaped redistribution pad, a conductive via disposed on the oblong-shaped or elliptical-shaped redistribution pad, and an under bump metallurgy covering the conductive via, wherein the conductive bump is disposed on the UBM. Furthermore, a package structure including the above-mentioned metallization structures is provided.

20 Claims, 20 Drawing Sheets

(51) Int. Cl.
  *H01L 23/00* (2006.01)
  *H01L 21/56* (2006.01)
(52) U.S. Cl.
  CPC ............ *H01L 24/16* (2013.01); *H01L 21/561* (2013.01); *H01L 21/568* (2013.01); *H01L 2224/16225* (2013.01)

(56) References Cited

U.S. PATENT DOCUMENTS

| | | | |
|---|---|---|---|
| 9,048,222 | B2 | 6/2015 | Hung et al. |
| 9,048,233 | B2 | 6/2015 | Wu et al. |
| 9,064,879 | B2 | 6/2015 | Hung et al. |
| 9,111,949 | B2 | 8/2015 | Yu et al. |
| 9,263,511 | B2 | 2/2016 | Yu et al. |
| 9,281,254 | B2 | 3/2016 | Yu et al. |
| 9,368,460 | B2 | 6/2016 | Yu et al. |
| 9,372,206 | B2 | 6/2016 | Wu et al. |
| 9,496,189 | B2 | 11/2016 | Yu et al. |
| 9,548,281 | B2 * | 1/2017 | Yew ........................ H01L 24/06 |
| 11,424,189 | B2 * | 8/2022 | Yu ......................... H01L 23/5386 |
| 2008/0283998 | A1 * | 11/2008 | Choi ................. H01L 23/49838 |
| | | | 257/E23.141 |
| 2013/0062741 | A1 * | 3/2013 | Wu ................... H01L 23/49838 |
| | | | 257/E21.705 |
| 2013/0105991 | A1 | 5/2013 | Gan et al. |
| 2023/0066370 | A1 * | 3/2023 | Hsu ........................ H01L 21/568 |

OTHER PUBLICATIONS

"Office Action of Taiwan Counterpart Application", dated Nov. 30, 2022, p. 1-p. 5.

\* cited by examiner

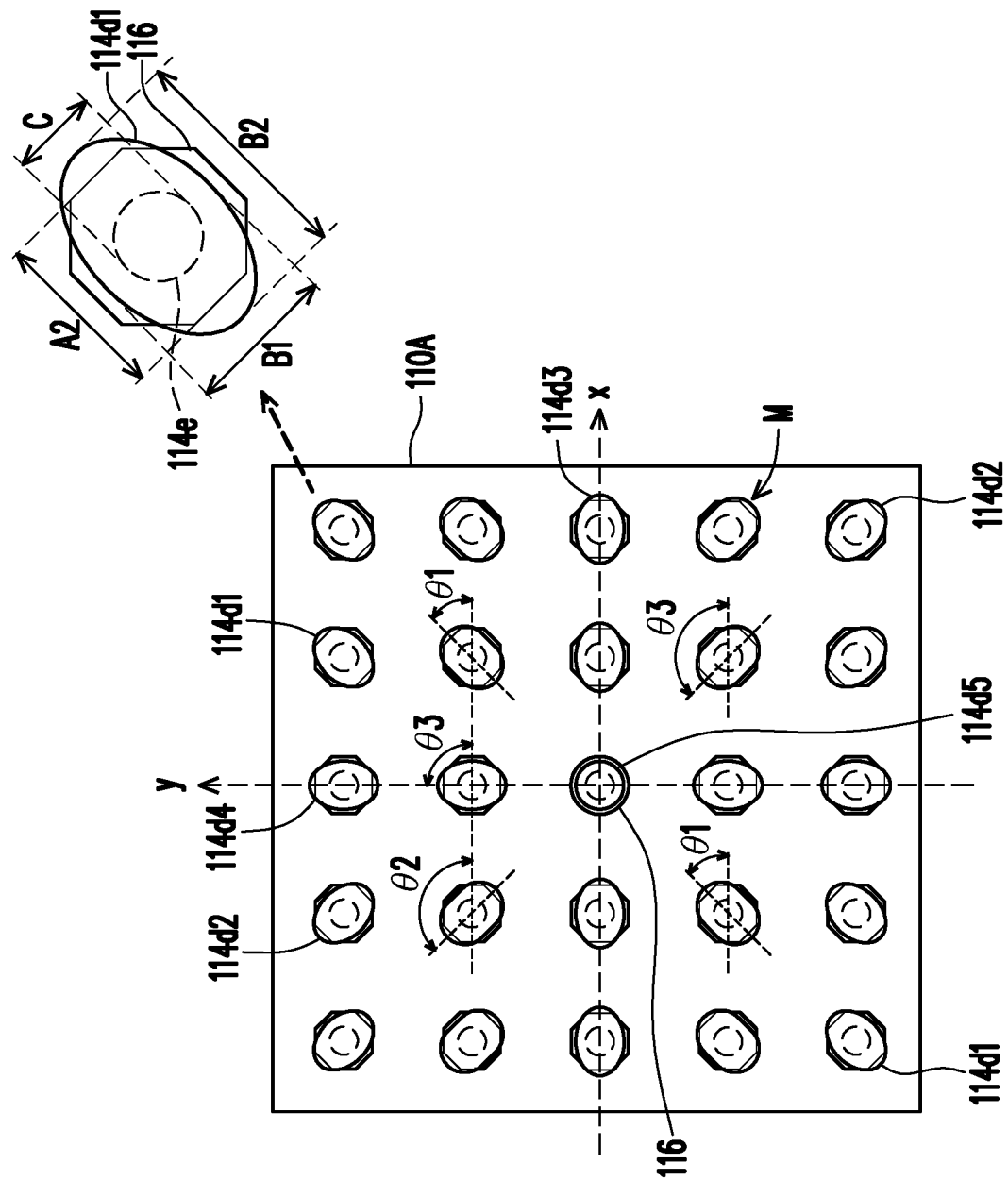

METALLIZATION STRUCTURE AND PACKAGE STRUCTURE

CROSS-REFERENCE TO RELATED APPLICATION

This application claims the priority benefit of U.S. provisional application Ser. No. 63/166,232, filed on Mar. 25, 2021. The entirety of the above-mentioned patent applications is hereby incorporated by reference herein and made a part of this specification.

BACKGROUND

The semiconductor industry has experienced rapid growth due to continuous improvements in the integration density of various electronic components (i.e., transistors, diodes, resistors, capacitors, etc.). For the most part, this improvement in integration density has come from repeated reductions in minimum feature size, which allows more of the smaller components to be integrated into a given area. These smaller electronic components also require smaller packages that utilize less area than previous packages. Some smaller types of packages for semiconductor components include quad flat packages (QFPs), pin grid array (PGA) packages, ball grid array (BGA) packages, and so on.

Currently, integrated fan-out packages are becoming increasingly popular for their compactness. In the integrated fan-out packages, the reliability of the redistribution circuit structure fabricated on the molding compound is highly concerned.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 16 is a bottom view schematically illustrating an arrangement of metallization structures in accordance with some other embodiments of the present disclosure.

DETAILED DESCRIPTION

Figure 1:
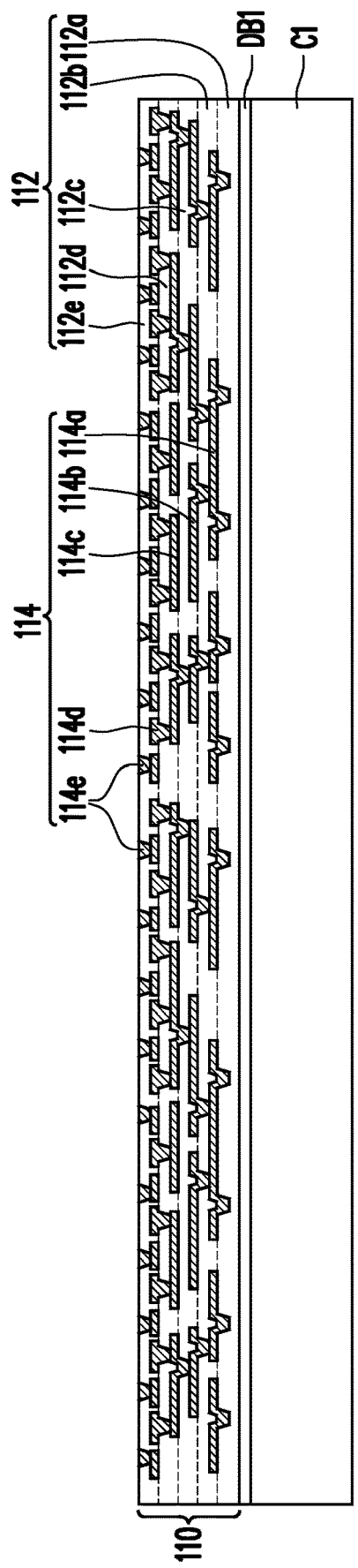
FIGS. 1 through 12 are cross-sectional views schematically illustrating a process flow for fabricating a package structure in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Package and the method of forming the same are provided in accordance with various exemplary embodiments. The intermediate stages of forming the package are illustrated. The variations of the embodiments are discussed. Throughout the various views and illustrative embodiments, like reference numbers are used to designate like elements.

FIGS. 1 through 12 are cross-sectional views schematically illustrating a process flow for fabricating a package structure in accordance with some embodiments of the present disclosure.

Referring to FIG. 1, a carrier C1 including a de-bonding layer DB1 formed thereon is provided. In some embodiments, the carrier C1 is a glass substrate, a ceramic carrier, or the like. The carrier C1 may have a round top-view shape and a size of a common silicon wafer. The carrier C1 may have an 8-inch diameter, a 12-inch diameter, or the like. The de-bonding layer DB1 may be formed of a polymer-based material (e.g., a Light To Heat Conversion (LTHC) material), which may be removed along with the carrier C1 from the overlying structures that will be formed in subsequent steps. In some embodiments, the de-bonding layer DB1 is formed of an epoxy-based thermal-release material. In other embodiments, the de-bonding layer DB1 is formed of an ultra-violet (UV) glue. The de-bonding layer DB1 may be dispensed as a liquid and cured. In some other embodiments, the de-bonding layer DB1 is a laminate film and is laminated onto the carrier C1. The top surface of the de-bonding layer DB1 is substantially planar.

A front side redistribution circuit structure 110 including stacked dielectric layers 112 and redistribution wirings 114 sandwiched between the stacked dielectric layers 112. The stacked dielectric layers 112 include a first dielectric layer 112a disposed on the de-bonding layer DB1, a second dielectric layer 112b covering the first dielectric layer 112a, a third dielectric layer 112c covering the second dielectric layer 112b, a fourth dielectric layer 112d covering the third dielectric layer 112c, and a fifth dielectric layer 112e covering the fourth dielectric layer 112d. The redistribution wirings 114 include first redistribution wirings 114a disposed between the first dielectric layer 112a and the second dielectric layer 112b, second redistribution wirings 114b disposed between the second dielectric layer 112b and the third dielectric layer 112c, third redistribution wirings 114c disposed between the third dielectric layer 112c and the fourth dielectric layer 112d, fourth redistribution wirings 114d disposed between the fourth dielectric layer 112d and the fifth dielectric layer 112e, and conductive vias 114e penetrating through the fifth dielectric layer 112e. The conductive vias 114e land on the fourth redistribution wirings 114d. In some embodiments, the stacked dielectric layers 112 are formed of polymer, which may also be photo-sensitive material such as polybenzoxazole (PBO), polyimide, benzocyclobutene (BCB), or the like, which may be easily patterned using a photolithography process. In some other embodiments, the stacked dielectric layers 112 are formed of nitride such as silicon nitride, oxide such as silicon oxide, PhosphoSilicate Glass (PSG), BoroSilicate Glass (BSG), Boron-doped PhosphoSilicate Glass (BPSG), or the like. The material of the redistribution wirings 114 may include copper, aluminum, alloy thereof, or the like. The formation of the redistribution wirings 114 may include forming a seed layer (not shown) over the dielectric layers 112, forming a patterned mask (not shown) such as a photoresist layer over the seed layer, and then performing a plating process on the exposed seed layer. The patterned mask and the portions of the seed layer covered by the patterned mask are then removed, leaving the redistribution wirings 114 as shown in FIG. 1. In accordance with some embodiments, the seed layer includes a titanium layer and a copper layer over the titanium layer. The seed layer may be formed using, for example, Physical Vapor Deposition (PVD). The plating process may be performed using, for example, electroless plating.

Figure 2:
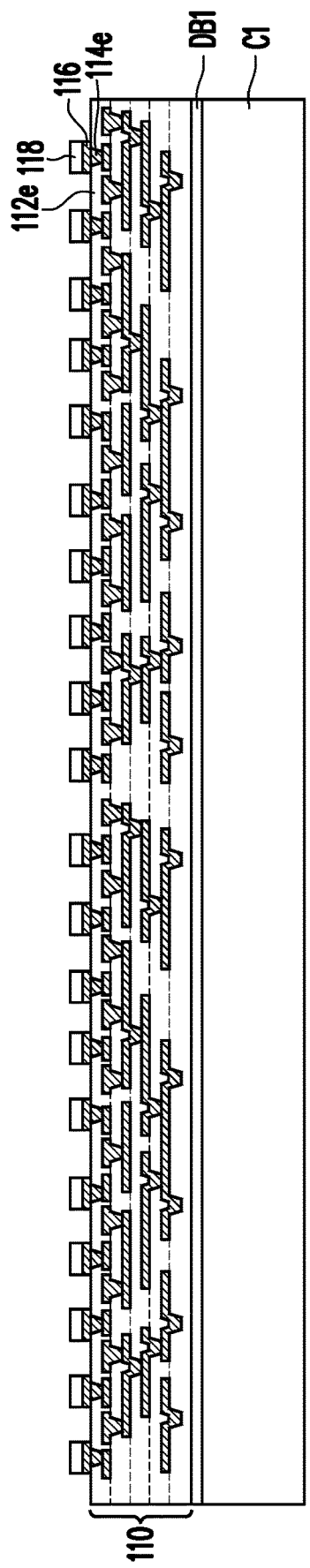

Referring to FIG. 1 and FIG. 2, after forming the front side redistribution circuit structure 110 over the de-bonding layer DB1 carried by the carrier C1, under bump metallurgies (UBM) 116 and joint material layers 118 are formed over the front side redistribution circuit structure 110. The under bump metallurgies 116 and the joint material layers 118 are electrically connected to the front side redistribution circuit structure 110. The under bump metallurgies 116 are formed to cover the conductive vias 114e. The joint material layers 118 are formed on the under bump metallurgies 116. In some embodiments, the under bump metallurgies 116 include copper layer or other metallic layers, and the joint material layers 118 include solder joints. The solder joints may include SnAg solder joints, SnAgCu solder joints, SnCu solder joints, AuSn solder joints, or other suitable Sn-based solder alloys. The formation of the under bump metallurgies 116 and the joint material layers 118 may include forming a seed layer (not shown) over the conductive vias 114e and the fifth dielectric layer 112e, forming a patterned mask (not shown) such as a photoresist layer over the seed layer, and then performing a multi-step plating process on the exposed seed layer. The patterned mask and the portions of the seed layer covered by the patterned mask are then removed, leaving the under bump metallurgies 116 and the joint material layers 118 as shown in FIG. 2. In accordance with some embodiments, the seed layer includes a titanium layer and a copper layer over the titanium layer. The seed layer may be formed using, for example, PVD. The multi-step plating process for forming the under bump metallurgies 116 and the joint material layers 118 may be performed using, for example, electroless plating.

Figure 3:
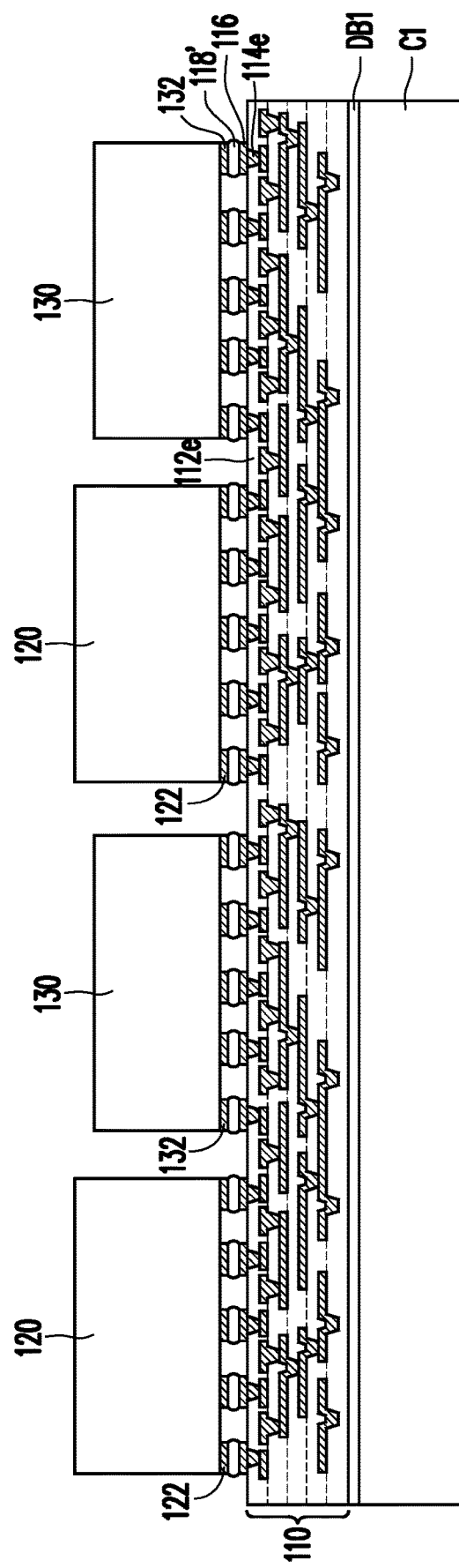

Referring to FIG. 3, after forming the under bump metallurgies 116 and the joint material layers 118 over the front side redistribution circuit structure 110, electronic components 120 including conductive bumps 122 (e.g., micro-bumps) formed thereon and electronic components 130 including conductive bumps 132 (e.g., micro-bumps) formed thereon are provided. The electronic components 120 and the electronic components 130 are picked-up and placed over the front side redistribution circuit structure 110 such that the conductive bumps 122 of the electronic components 120 and the conductive bumps 132 of the electronic components 130 are physically in contact with the joint material layers 118. Then, a reflow process is performed such that the conductive bumps 122 of the electronic components 120 and the conductive bumps 132 of the electronic components 130 are bonded to the under bump metallurgies 116 through the melt joint material layers 118' (i.e. conductive bumps 118') such that the electronic components 120 and the electronic components 130 are electrically connected to the front side redistribution circuit structure 110. In some embodiments, as illustrated in FIG. 3, the thickness of the electronic components 120 is greater than the thickness of the electronic components 130. In some other embodiments, not illustrated in FIG. 3, the thickness of the electronic components 120 is substantially equal to or less than the thickness of the electronic components 130.

In some embodiments, the electronic components 120 includes semiconductor dies such as system on chip (SoC) dies, system on integrated circuit (SoIC) dies, application specific integrated-circuit (ASIC) dies, graphical processing unit (GPU) chips, power management integrated circuit (PMIC) dies, radio frequency (RF) dies, sensor dies, micro-electro-mechanical-system (MEMS) dies, signal processing dies (e.g., digital signal processing (DSP) dies), front-end dies (e.g., analog front-end (AFE) dies), the like, or a combination thereof. In another embodiments, the electronic components 120 include semiconductor packages integrated fan-out (InFO) large scale integration (LSI) packages. For example, the electronic components 120 include central processing units (CPU), field programmable gate array (FPGA) units, microcontrollers, or the like. The electronic components 120 may be a combination of any of the above-mentioned candidate in numbers more or less than the number of electronic components 120 shown in FIG. 3. In some embodiment, the electronic components 130 include memory devices such as high bandwidth memories (HBM), dynamic random access memories (DRAM), static random access memories (SRAM), or combinations thereof. In some other embodiments, the electronic components 130 include passive components (e.g., resistors, inductors, capacitors etc.). The electronic components 130 may be a combination of any of the above-mentioned candidate in numbers more or less than the number of electronic components 130 shown in FIG. 3.

Figure 4:
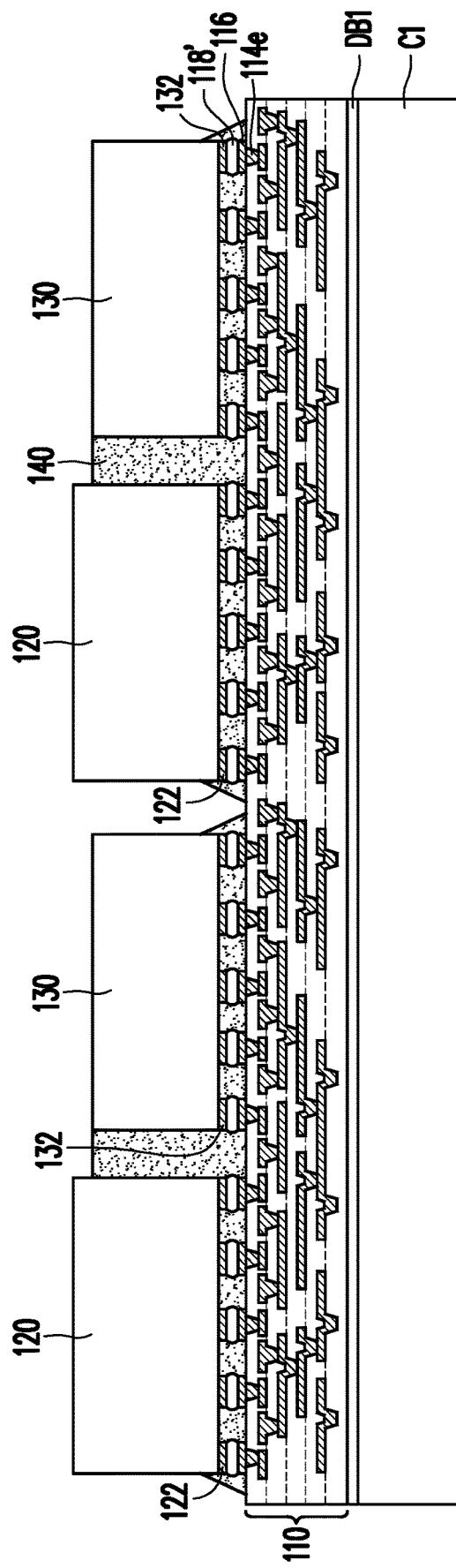

Referring to FIG. 4, after the electronic components 120 and the electronic components 130 are mounted over the front side redistribution circuit structure 110, underfills 140 are formed over the front side redistribution circuit structure 110 such that gaps between the electronic components 120 and the front side redistribution circuit structure 110 as well as gaps between the electronic components 130 and the front side redistribution circuit structure 110 are filled with the underfills 140. In some embodiments, as illustrated in FIG. 4, the underfills 140 may fill gaps between adjacent electronic components 120 and electronic components 130. The underfills 140 are typically polymer, for example, epoxy. The underfills 140 may be made to flow between the electronic components 120/130 and the front side redistribution circuit structure 110, using capillary action. When formed from a material such as a polymer epoxy, the underfills 140 are then typically cured, to harden the polymer. The cured underfills 140 laterally encapsulate the under bump metallurgies 116, the conductive bumps 122, the conductive bumps 132, and the conductive bumps 118' and acts to protect the under bump metallurgies 116, the conductive bumps 122, the conductive bumps 132, and the conductive bumps 118', as well as to support the electronic components 120 and 130 on the front side redistribution circuit structure 110.

Figure 5:
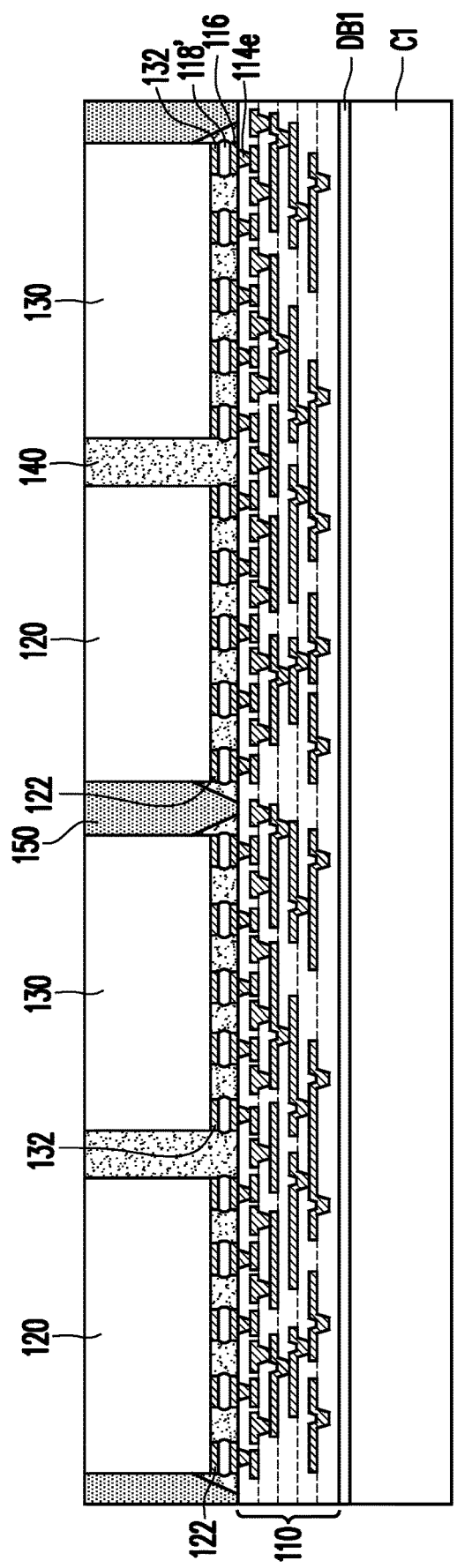

Referring to FIG. 5, an insulating encapsulant 150 is formed over the front side redistribution circuit structure 110 to laterally encapsulate the electronic components 120 and the electronic components 130. In some embodiments, an insulating encapsulation material is formed over the front side redistribution circuit structure 110 to encapsulate the electronic components 120, the electronic components 130, and the underfills 140. The insulating encapsulation material may be a molding compound (e.g., epoxy or other suitable resin) formed through an over-molding process. The insulating encapsulation material fills the gaps between neighboring electronic components 120 and electronic components 130 which are not occupied by the underfills 140. Then, a planarization process such as a Chemical Mechanical Polish (CMP) process and/or a mechanical grinding process is performed to partially remove the insulating encapsulation material until back surfaces of the electronic components 120 and back surfaces of the electronic components 130 are exposed. In some embodiments, portions of the underfills 140 filled between the electronic components 120 and the electronic components 130 are exposed as well after performing the planarization process. After the insulating encapsulation material is thinned down, an insulating encapsulant 150 is formed to laterally encapsulate the electronic components 120 and the electronic components 130. Due to the planarization process, the back surfaces of the electronic components 120 and the back surfaces of the electronic components 130 are substantially level or coplanar with the top surface of the insulating encapsulant 150. In some embodiments, due to the planarization process, the back surfaces of the electronic components 120 and the back surfaces of the electronic components 130 are substantially level or coplanar with the top surfaces of the underfills 140 and the top surface of the insulating encapsulant 150. In the illustrated exemplary embodiments, the planarization process is performed until the back surfaces of the electronic components 120, the back surfaces of the electronic components 130, and the top surfaces of the underfills 140 are exposed.

Figure 6:
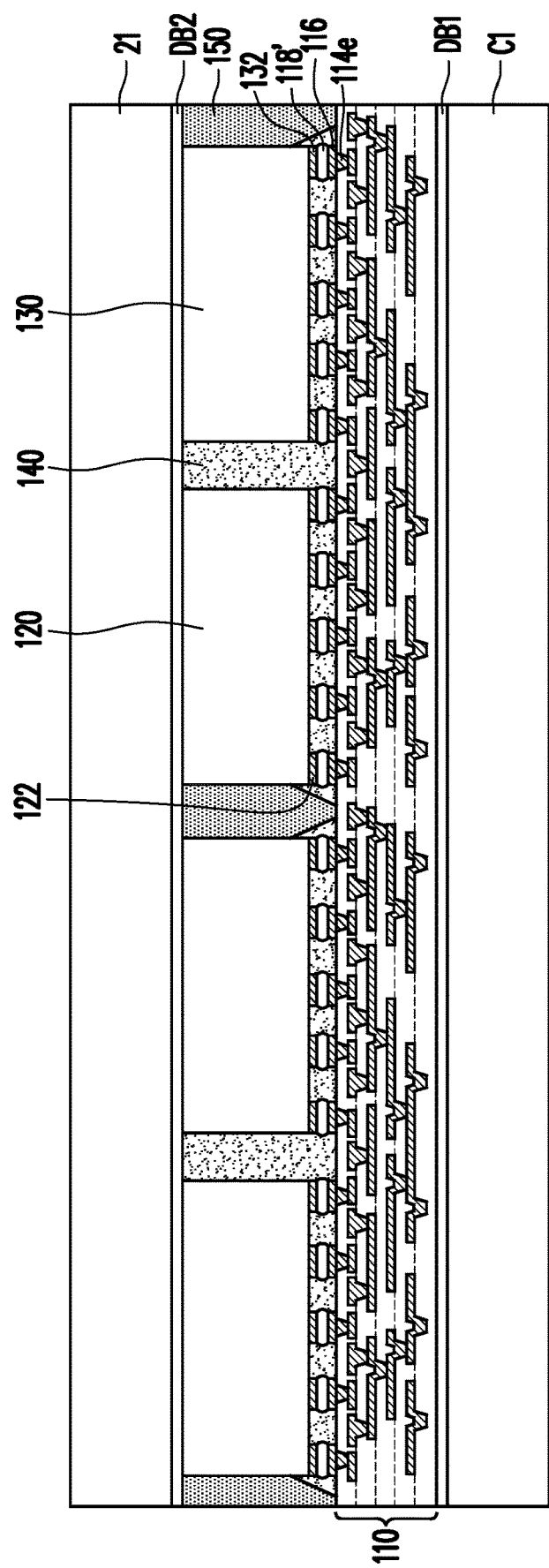
Figure 7:
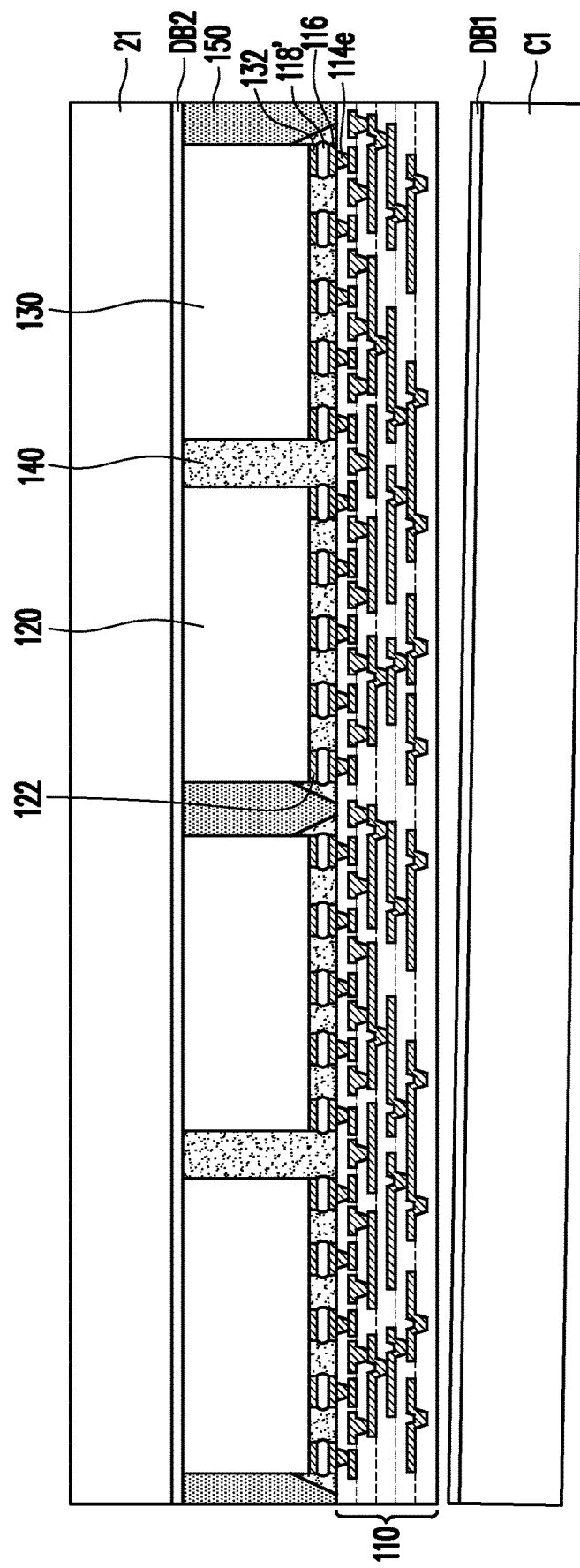

Referring to FIG. 6 and FIG. 7, a transfer bonding process is performed such that the structure formed over the de-bonding layer DB1 carried by the carrier C1 is transferred onto a de-bonding layer DB2 carried by a carrier C2. As illustrated in FIG. 6, a carrier C2 including a de-bonding layer DB2 formed thereon is provided. In some embodiments, the carrier C2 is a glass substrate, a ceramic carrier, or the like. The carrier C2 may have a round top-view shape and a size of a common silicon wafer. The carrier C2 may have an 8-inch diameter, a 12-inch diameter, or the like. The de-bonding layer DB2 may be formed of a polymer-based material (e.g., a Light To Heat Conversion (LTHC) material), which may be removed along with the carrier C2 from the overlying structures that will be formed in subsequent steps. In some embodiments, the de-bonding layer DB2 is formed of an epoxy-based thermal-release material. In other embodiments, the de-bonding layer DB2 is formed of an ultra-violet (UV) glue. The de-bonding layer DB2 may be dispensed as a liquid and cured. In some other embodiments, the de-bonding layer DB2 is a laminate film and is laminated onto the carrier C2. The top surface of the de-bonding layer DB2 is substantially planar. As illustrated in FIG. 6, the back surfaces of the electronic components 120, the back surfaces of the electronic components 130, the top surfaces of the underfills 140, and the top surface of the insulating encapsulant 150 are attached to the de-bonding layer DB2 carried by the carrier C2.

As illustrated in FIG. 7, the carrier C1 is removed. In some embodiments, the carrier C1 is detached from the front side redistribution circuit structure 110, by directly stripping or causing the de-bonding layer DB1 on the carrier C1 to lose or reduce adhesion. The de-bonding layer DB1 is then removed along with the carrier C1. For example, the de-bonding layer DB1 may be exposed to UV light, so that the de-bonding layer DB1 loses or reduces adhesion, and hence the carrier C1 and the de-bonding layer DB1 can be removed from the front side redistribution circuit structure 110 to reveal a lower surface of the front side redistribution circuit structure 110.

Figure 8:
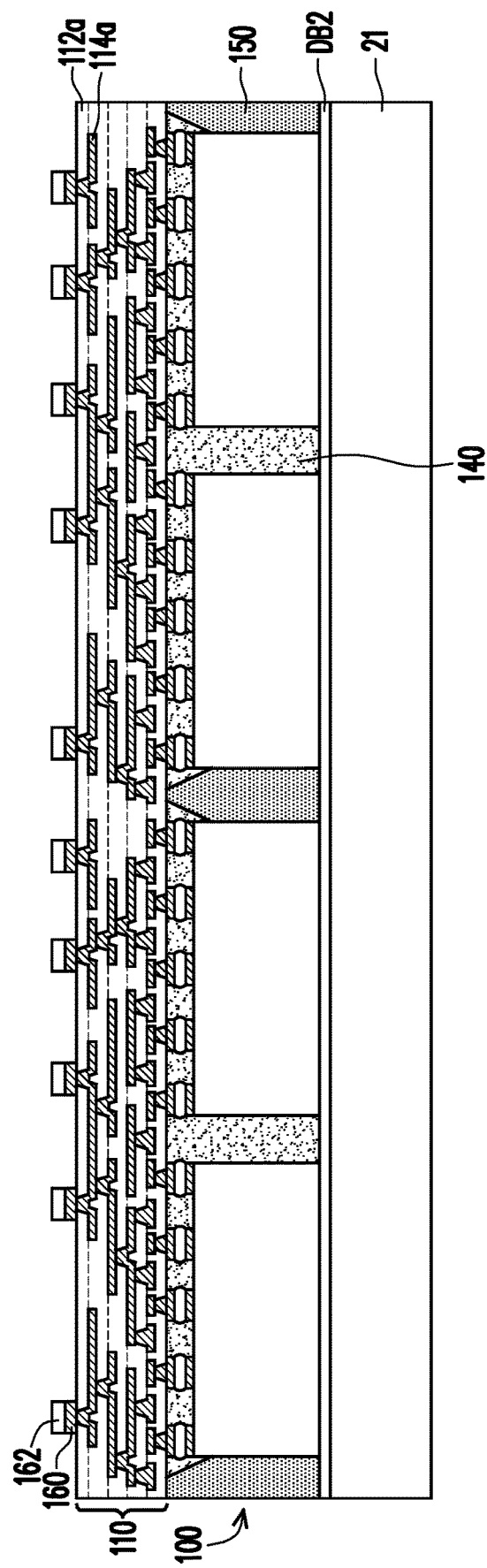

Referring to FIG. 8, conductive bumps 160 and joint material layers 162 are formed over the lower surface of the front side redistribution circuit structure 110. In some embodiments, the conductive bumps 160 and joint material layers 162 are formed over the first dielectric layer 112a. Further, the conductive bumps 160 and joint material layers 162 are electrically connected to the first redistribution wirings 114a of the front side redistribution circuit structure 110. The joint material layers 162 are formed on the conductive bumps 160. In some embodiments, the conductive bumps 160 include controlled collapse chip connection (C4) copper bumps or other metallic C4 bumps, and the joint material layers 162 include solder joints. The solder joints may include SnAg solder joints, SnAgCu solder joints, SnCu solder joints, AuSn solder joints, or other suitable Sn-based solder alloys. The formation of the conductive bumps 160 and the joint material layers 162 may include forming a seed layer (not shown) over the first redistribution wirings 114a and the first dielectric layer 112a, forming a patterned mask (not shown) such as a photoresist layer over the seed layer, and then performing a multi-step plating process on the exposed seed layer. The patterned mask and the portions of the seed layer covered by the patterned mask are then removed, leaving the conductive bumps 160 and the joint material layers 162 as shown in FIG. 8. In accordance with some embodiments, the seed layer includes a titanium layer and a copper layer over the titanium layer. The seed layer may be formed using, for example, PVD. The multi-step plating process for forming the conductive bumps 160 and the joint material layers 162 may be performed using, for example, electroless plating. After forming the conductive bumps 160 and the joint material layers 162, a wafer level structure 100 is fabricated over the carrier C2.

Figure 9:
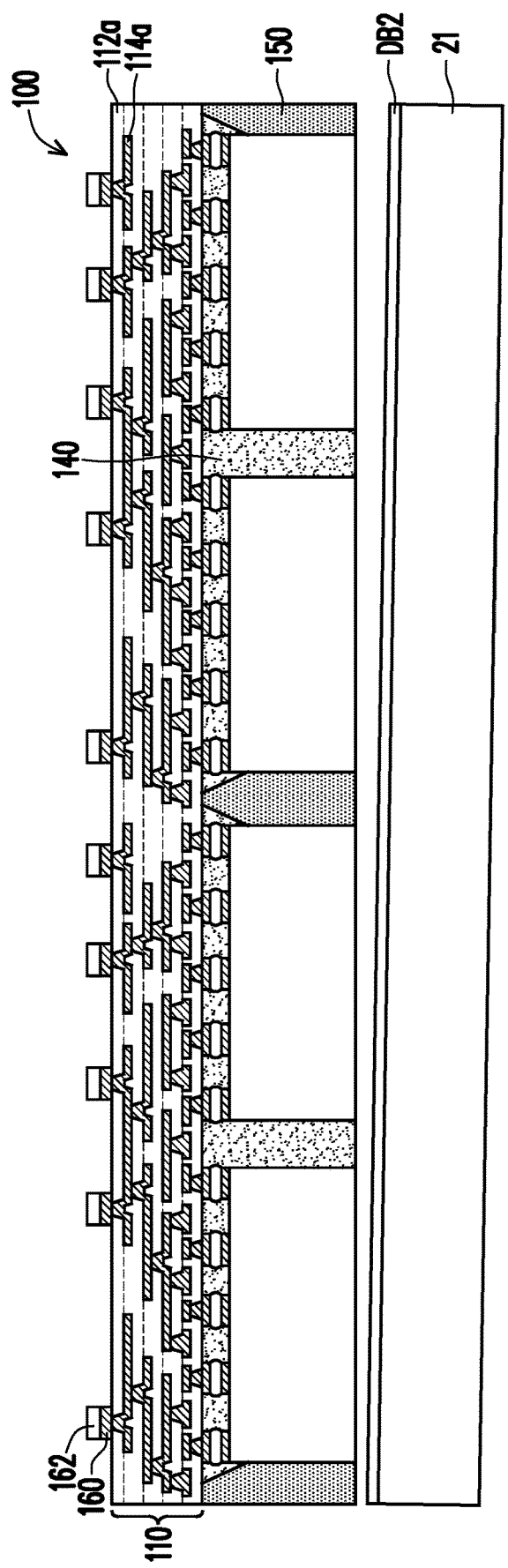

Referring to FIG. 9, the carrier C2 is removed from the wafer level structure 100. In some embodiments, the carrier C2 is detached from the back surfaces of the electronic components 120, the back surfaces of the electronic components 130, the top surfaces of the underfills 140 and the top surface of the insulating encapsulant 150, by directly stripping or causing the de-bonding layer DB2 on the carrier C2 to lose or reduce adhesion. The de-bonding layer DB2 is then removed along with the carrier C2. For example, the de-bonding layer DB2 may be exposed to UV light, so that the de-bonding layer DB2 loses or reduces adhesion, and hence the carrier C2 and the de-bonding layer DB2 can be removed from the front side redistribution circuit structure 110 to reveal the back surfaces of the electronic components 120, the back surfaces of the electronic components 130, the top surfaces of the underfills 140, and the top surface of the insulating encapsulant 150.

Figure 10:
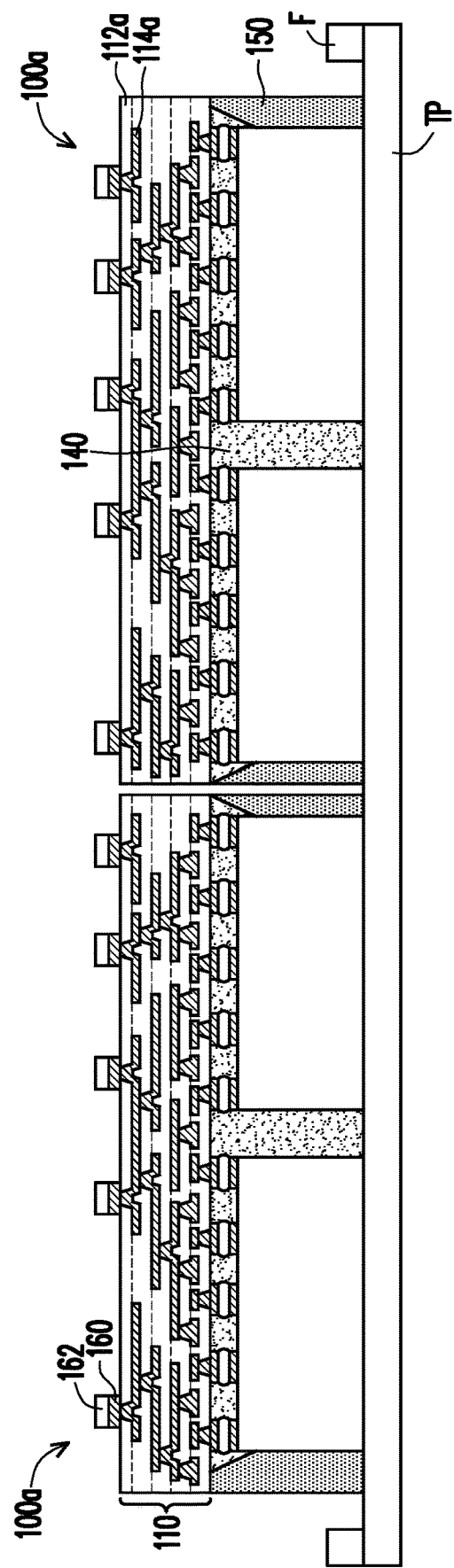

Referring to FIG. 10, after the wafer level structure 100 is detached from the carrier C2, the wafer level structure 100 is mounted onto a tape TP carried by a frame F. In some embodiments, the back surfaces of the electronic components 120, the back surfaces of the electronic components 130, the top surfaces of the underfills 140, and the top surface of the insulating encapsulant 150 are adhered with the tape TP. Then, the wafer level structure 100 is singulated by a wafer sawing process such that singulated package structures 100a are obtained. Each singulated package structure 100a may include a front side redistribution circuit structure 110, at least one electronic component 120, at least one electronic component 130, an underfill 140, an insulating encapsulant 150, conductive bumps 160 and joint material layers 162. The electronic component 120 and the electronic component 130 are disposed on a first surface of the front side redistribution circuit structure 110 in a side-by-side manner. The electronic component 120 and the electronic component 130 are electrically connected to the front side redistribution circuit structure 110. The underfill 140 fills the gap between the electronic component 120 and the first surface of the front side redistribution circuit structure 110, the gap between the electronic component 130 and the first surface of the front side redistribution circuit structure 110, and the gap between the electronic component 120 and the electronic component 130. The insulating encapsulant 150 covers the first surface of the front side redistribution circuit structure 110 and laterally encapsulates the electronic component 120, the electronic component 130, and the underfill 140. The conductive bumps 160 and joint material layers 162 are disposed on a second surface of the front side redistribution circuit structure 110, and the second surface of the front side redistribution circuit structure 110 is opposite to the first surface of the front side redistribution circuit structure 110.

As illustrated in FIG. 10, the back surfaces of the electronic components 120 and the back surfaces of the electronic components 130 are substantially level or coplanar with the top surfaces of the underfills 140 and the top surface of the insulating encapsulant 150. Furthermore, sidewalls of the insulating encapsulant 150 are substantially aligned with sidewalls of the front side redistribution circuit structure 110.

Figure 11:
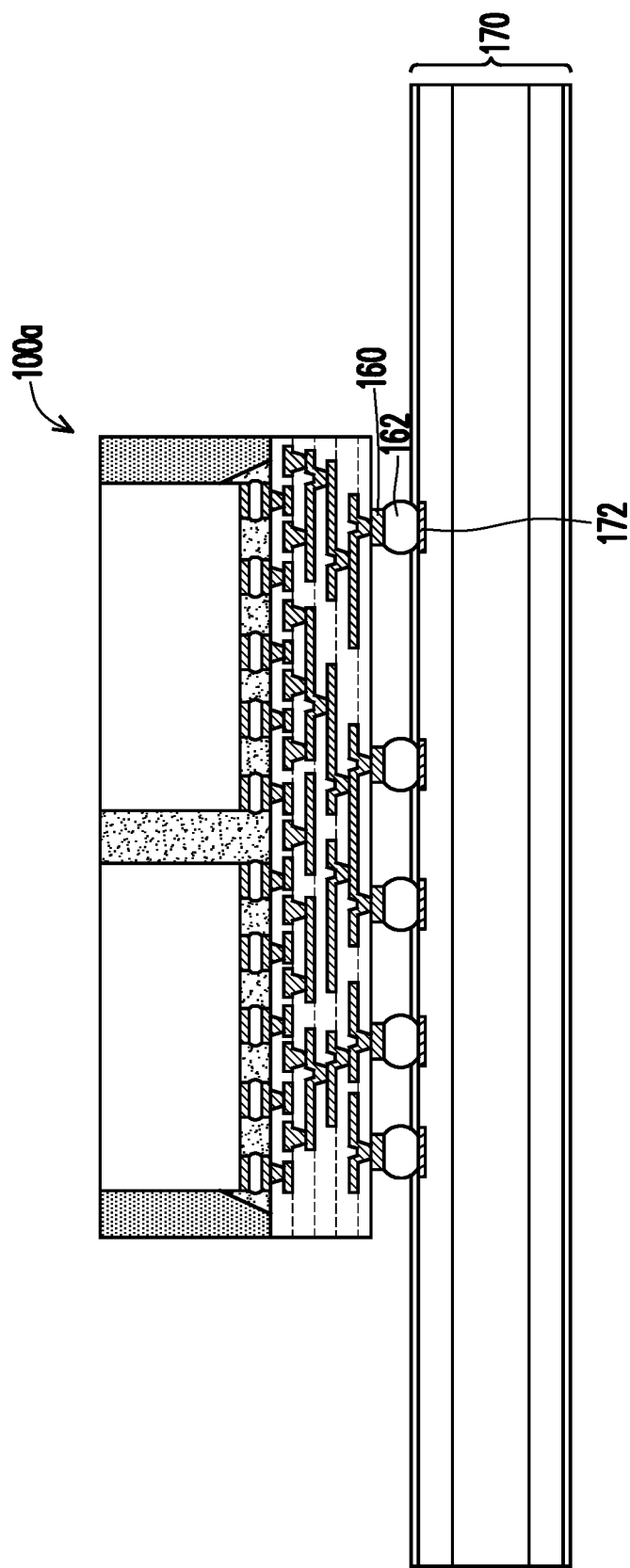
Figure 12:
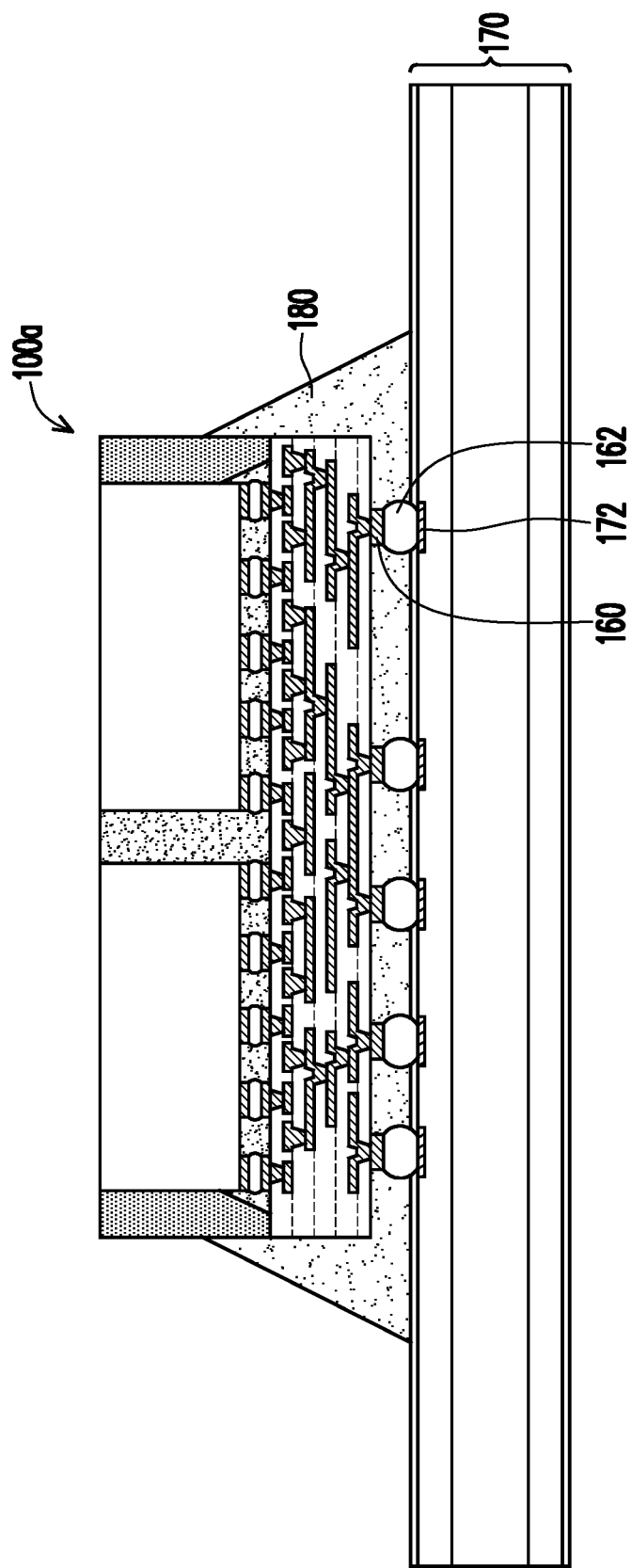

Referring to FIG. 11 and FIG. 12, a package substrate 170 including bump pads 170 is provided. The singulated package structure 100a is picked-up and placed over the package substrate 170 such that the singulated package structure 100a is electrically connected to the bump pads 170 of the package substrate 170 through conductive terminals (e.g., the conductive bumps 160 and the joint material layers 162). Then, an underfill 180 is formed over the package substrate 170 such that the gap between the singulated package structure 100a and the package substrate 170 is filled with the underfill 180. The underfill 180 may partially covers sidewalls of the singulated package structure 100a. In some embodiments, as illustrated in FIG. 12, sidewalls of the front side redistribution circuit structure 110 are entirely covered by the underfill 180, and sidewalls of the insulating encapsulant 150 are partially covered by the underfill 180. The underfill 180 is typically polymer, for example, epoxy. The underfill 180 may be made to flow between the singulated package structure 100a and the package substrate 170, using capillary action. When formed from a material such as a polymer epoxy, the underfill 180 is then typically cured, to harden the polymer. The cured underfill 180 laterally encapsulate the conductive bumps 160 and the joint material layers 162, as well as support the singulated package structure 100a on the package substrate 170.

Figure 13:
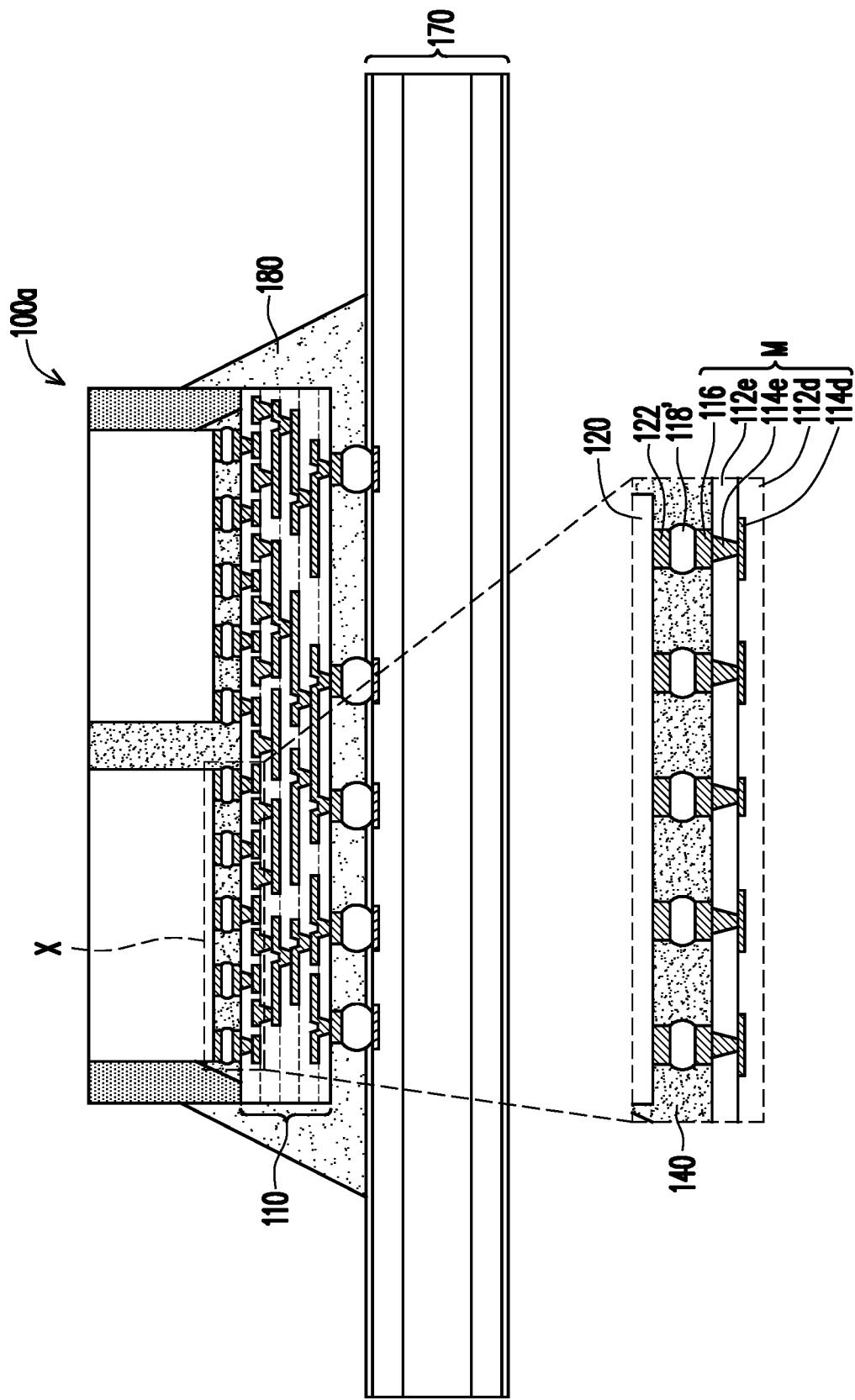
FIG. 13 is a cross-sectional view schematically illustrating an enlarged region of a package structure in accordance with some embodiments of the present disclosure.

FIG. 13 is a cross-sectional view schematically illustrating an enlarged region X of a package structure 100a in accordance with some embodiments of the present disclosure.

Referring to FIG. 13, in the enlarged region X of the package structure 100a, the conductive bumps 118', the electronic components 120 including the conductive bumps 122, metallization structures M, and the underfill 140 are illustrated. The metallization structures M are electrically connected to the conductive bumps 122 of the electronic components 120 through the conductive bumps 118'. The metallization structures M include the fourth dielectric layer 112d, the fifth dielectric layer 112e, the fourth redistribution wirings 114d, the conductive vias 114e, and the under bump metallurgies 116. The fourth redistribution wirings 114d are sandwiched between the fourth dielectric layer 112d and the fifth dielectric layer 112e. The conductive vias 114e land on the fourth redistribution wirings 114d and penetrate through the fifth dielectric layer 112e. The under bump metallurgies 116 may be circle-shaped under bump metallurgies and cover the conductive vias 114e and portions of the fifth dielectric layer 112e.

Figure 14:
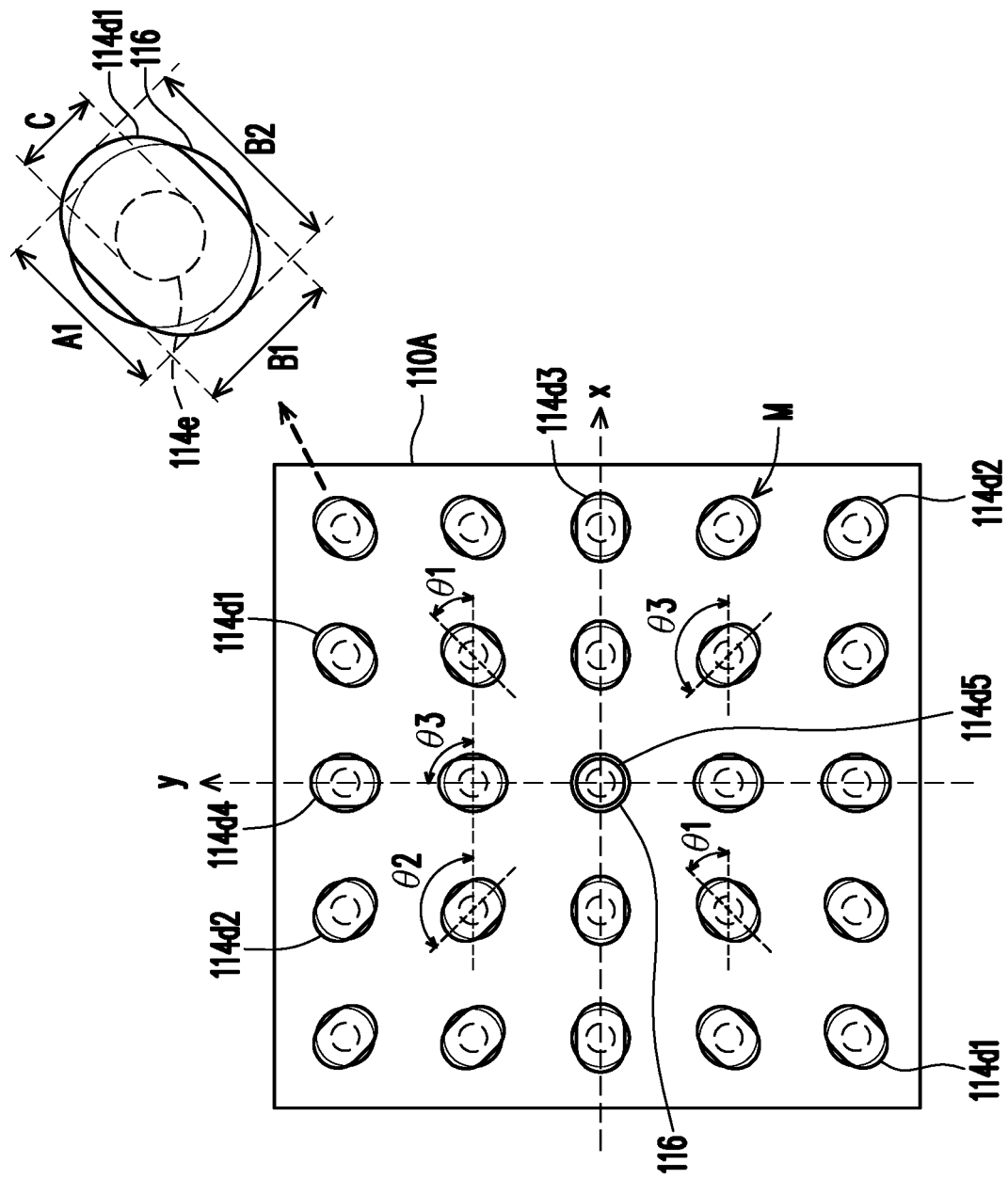
FIG. 14 is a bottom view schematically illustrating an arrangement of metallization structures in accordance with some embodiments of the present disclosure.

FIG. 14 is a bottom view schematically illustrating an arrangement of metallization structures M in accordance with some embodiments of the present disclosure.

Referring to FIG. 14, a die bonding area 110A of the front side redistribution circuit structure 110 covered by the electronic component 120 and/or electronic component 130 may be categorized into four quadrants I, II, II, and IV by Cartesian coordinate with a center of the die bonding area 110A as origin. The fourth redistribution wirings 114d may include oblong-shaped redistribution pads 114d1 located on quadrant I and quadrant III, oblong-shaped redistribution pads 114d2 located on quadrant II and quadrant IV, oblong-shaped redistribution pads 114d3 distributed along x-axis, and oblong-shaped redistribution pads 114d4 distributed along x-axis. The oblong-shaped redistribution pads 114d1, 114d2, 114d3, and 114d4 have respective orientations. The oblong-shaped redistribution pads 114d1, 114d2, 114d3, and 114d4 have one pair of straight edges paralleled with long axis. In some embodiments, the fourth redistribution wirings 114d further include a central redistribution pad 114d5 located at the center of the die bonding area 110A (i.e., a location where x-axis of Cartesian coordinate and y-axis of Cartesian coordinate cut across). The metallization structures M including the oblong-shaped redistribution pads 114d1, 114d2, 114d3, and 114d4 are defined as first metallization structures, and the metallization structure M including a central redistribution pad 114d5 is defined as a second metallization structure. In the first metallization structures, length of the oblong-shaped redistribution pads 114d1, 114d2, 114d3, and 114d4 in long axis is longer than the diameter of the under bump metallurgies 116, and length of the oblong-shaped redistribution pads 114d1, 114d2, 114d3, and 114d4 in short axis is shorter than the diameter of the under bump metallurgies 116 located above the oblong-shaped redistribution pads 114d1, 114d2, 114d3, and 114d4. In the second metallization structure, the central redistribution pad 114d5 is a circle-shaped redistribution pad, and the central redistribution pad 114d5 is smaller than the under bump metallurgy 116. In other words, the diameter of the central redistribution pad 114d5 is smaller than the diameter of the under bump metallurgy 116 located above the central redistribution pad 114d5.

A first orientation of the oblong-shaped redistribution pads 114d1 located on quadrant I and quadrant III is different a second orientation of oblong-shaped redistribution pads 114d2 located on quadrant II and quadrant IV. In some embodiments, first long axes of the oblong-shaped redistribution pads 114d1 located on quadrant I and quadrant III are substantially parallel with each other. In some embodiments, second long axes of the oblong-shaped redistribution pads 114d2 located on quadrant II and quadrant IV are substantially parallel with each other, and the first long axes of the oblong-shaped redistribution pads 114d1 are different from the second long axes of the oblong-shaped redistribution pads 114d2. For example, an included angle θ1 between long axis of each of the oblong-shaped redistribution pads 114d1 located in quadrant I and quadrant III and x-axis of Cartesian coordinate is between 0° and 90°. An included angle θ2 between long axis of each of the oblong-shaped redistribution pads 114d2 located in quadrant II and quadrant IV and x-axis of Cartesian coordinate is between 90° and 180°. In some embodiments, the long axes of the oblong-shaped redistribution pads 114d3 located on x-axis are substantially parallel with x-axis. In other words, an included angle θ3 between long axis of each of the oblong-shaped redistribution pads 114d3 and x-axis of Cartesian coordinate is 90°. In some embodiments, the long axes of the oblong-shaped redistribution pads 114d4 located on y-axis are substantially parallel with y-axis.

In some embodiments, centers of the oblong-shaped redistribution pads 114d1, 114d2, 114d3, and 114d4 are substantially aligned with centers of the under bump metallurgies 116 located above the oblong-shaped redistribution pads 114d1, 114d2, 114d3, and 114d4. As illustrated in FIG. 14, the under bump metallurgies 116 are circle-shaped under bump metallurgies, wherein A1 represents a diameter of circle-shaped under bump metallurgies 116, B1 represents a length of the oblong-shaped redistribution pads 114d1, 114d2, 114d3 or 114d4 in short axis, B2 represents a length of the oblong-shaped redistribution pads 114d1, 114d2, 114d3 or 114d4 in long axis, C represents a diameter of conductive vias 114e, and A1, B1, B2 and C satisfy the following inequality (1):

$$B2 > A1 \geq B1 > C \qquad (1).$$

In some embodiments, A1 and C satisfy the following inequality (2):

$$6.4 \geq A1/C \geq 1.5 \qquad (2).$$

In some embodiments, A1, B1, and B2 satisfy the following inequalities (3)-(5):

$$1 \geq B1/A1 \geq 0.6 \qquad (3);$$

$$3 \geq B2/A1 > 1 \qquad (4); \text{ and}$$

$$3 \geq B2/B1 > 1 \qquad (5).$$

Figure 15:
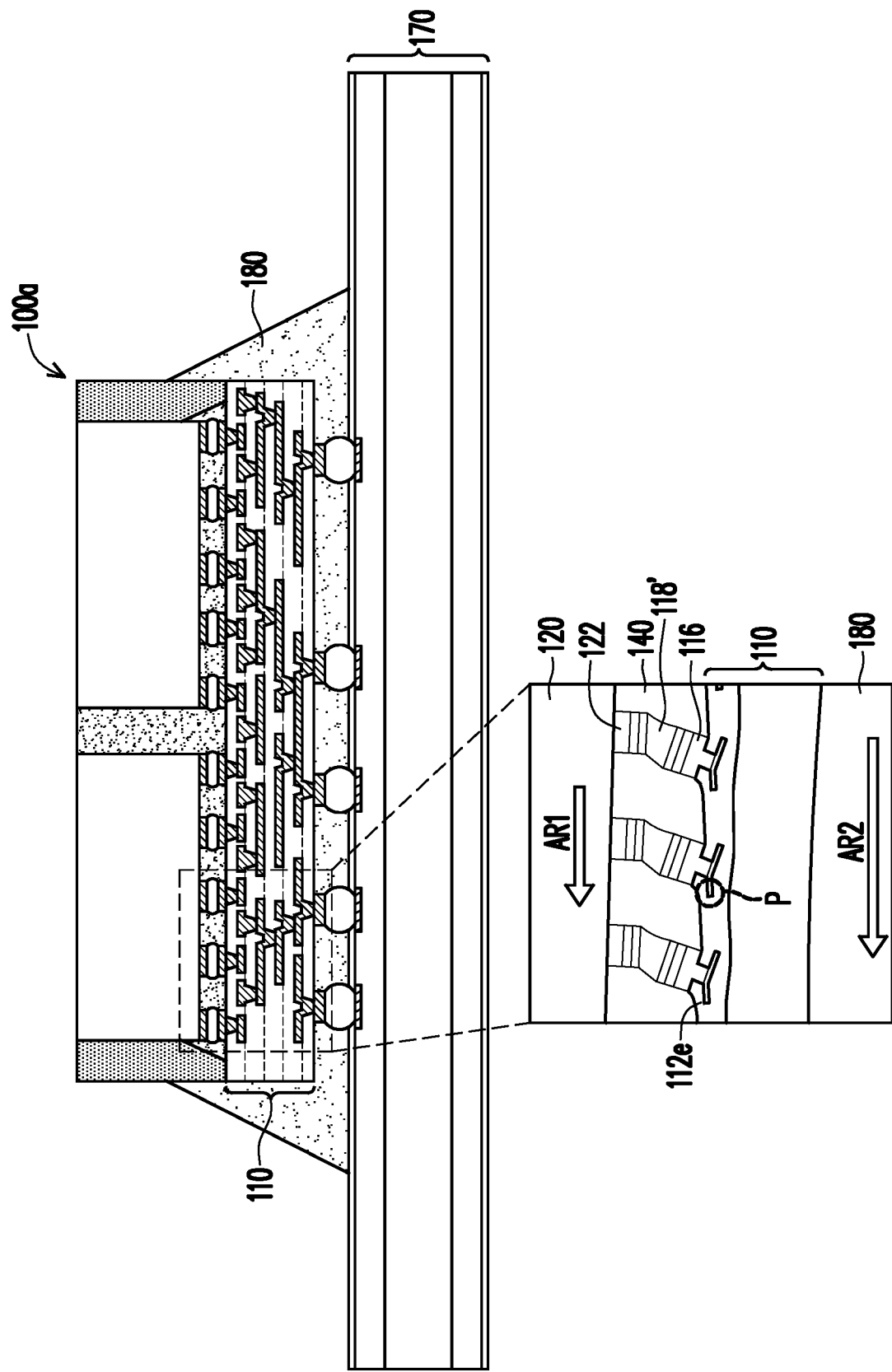
FIG. 15 is a cross-sectional view schematically illustrating deformation of the bumps resulted from Coefficient of Thermal Expansion (CTE) mismatch in accordance with some embodiments of the present disclosure.

FIG. 15 is a cross-sectional view schematically illustrating deformation of the bumps resulted from Coefficient of Thermal Expansion (CTE) mismatch in accordance with some embodiments of the present disclosure.

Referring to FIG. 15, since the CTE of the electronic component 120. As illustrated in FIG. 15, since the CTE of the electronic component 120 is less than the CTE of the package substrate 170, the shearing force resulted from CTE mismatch between the electronic component 120 and the package substrate 170 causes deformation of conductive terminals (e.g., the under bump metallurgies 116, the conductive bumps 118', and the conductive bumps 122) and the fifth dielectric layer 112e. Polymer stress occurs at the position P is simulated. Base on simulation results, compared to circle-shaped redistribution pads design, about 19% stress reduction may be achieved by the oblong-shaped redistribution pads 114d1, 114d2, 114d3, and 114d4. As illustrated in FIG. 14 and FIG. 15, the arrow AR1 represents the amount of thermal expansion of the electronic component 120 while the arrow AR2 represents the amount of thermal expansion of the package substrate 170. The amount of thermal expansion of the package substrate 170 may be greater than the amount of thermal expansion of the electronic component 120. In the case of the position P is closer to the center of the die bonding area 110A, the conductive bumps 122, the under bump metallurgies 116 and the conductive bumps 118' located in proximity to the position P may suffer more stress. In the case of the position P is farther away from the center of the die bonding area 110A (illustrated in FIG. 14), the conductive bumps 122, the under bump metallurgies 116 and the conductive bumps 118' located in proximity to the position P may suffer less stress.

FIG. 16 is a bottom view schematically illustrating an arrangement of metallization structures in accordance with some other embodiments of the present disclosure.

Referring to FIG. 14 and FIG. 16, the metallization structures illustrated in FIG. 16 are similar to the metallization structures illustrated in FIG. 14 except for the elliptical-shaped redistribution pads 114d1, 114d2, 114d3, and 114d4 and the octagon-shaped under bump metallurgies 116. Centers of the elliptical-shaped redistribution pads 114d1, 114d2, 114d3, and 114d4 are substantially aligned with centers of the octagon-shaped under bump metallurgies 116 located above the elliptical-shaped redistribution pads 114d1, 114d2, 114d3, and 114d4. The center of the circle-shaped central redistribution pad 114d5 is substantially aligned with the center of the circle-shaped under bump metallurgies 116 located above the central redistribution pad 114d5. As illustrated in FIG. 16, A2 represents a distance between a pair of opposite sides of the octagon-shaped under bump metallurgies 116, B1 represents a length of the oblong-shaped redistribution pads 114d1, 114d2, 114d3 or 114d4 in short axis, B2 represents a length of the oblong-shaped redistribution pads 114d1, 114d2, 114d3 or 114d4 in long axis, C represents the diameter of conductive vias 114e, and A2, B1, B2 and C satisfy the following inequality (6):

$$B2 > A2 \geq B1 > C \qquad (6).$$

In some embodiments, A2 and C satisfy the following inequality (7):

$$6.4 \geq A2/C \geq 1.5 \qquad (7).$$

In some embodiments, A2, B1, and B2 satisfy the following inequalities (8)-(10):

$$1 \geq B1/A2 \geq 0.6 \qquad (8);$$

$$3 \geq B2/A2 > 1 \qquad (9); \text{ and}$$

$$3 \geq B2/B1 > 1 \qquad (10).$$

FIGS. 17A through 17D are bottom views schematically illustrating various metallization structures in accordance with various embodiments of the present disclosure.

Figure 17B:
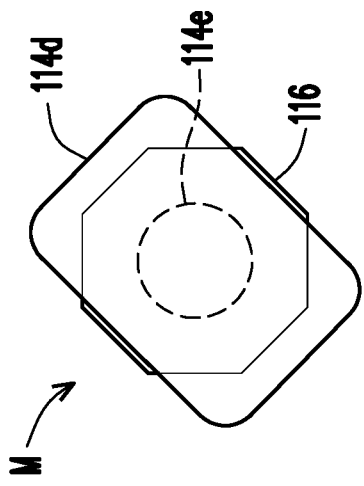
FIGS. 17A through 17D are bottom views schematically illustrating various metallization structures in accordance with various embodiments of the present disclosure.
Figure 17D:
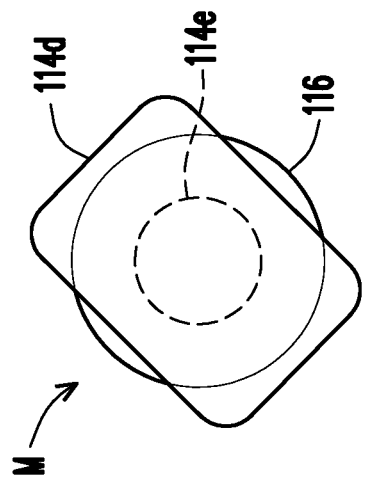
Figure 17A:
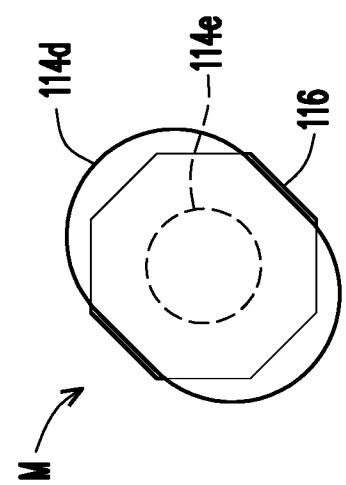

Referring to FIG. 17A and FIG. 17B, a metallization structure includes an oblong-shaped redistribution pads 114d, a circle-shaped conductive via 114e, and an octagon-shaped under bump metallurgy 116. The circle-shaped conductive via 114e is sandwiched between the oblong-shaped redistribution pads 114d and the octagon-shaped under bump metallurgy 116. In FIG. 17A, the oblong-shaped redistribution pad 114d includes one pair of straight edges paralleled with long axis. In FIG. 17B, the oblong-shaped redistribution pad 114d includes a first pair of straight edges paralleled with long axis and a second pair of straight edges paralleled with short axis. The oblong-shaped redistribution pads 114d is electrically connected to the octagon-shaped under bump metallurgy 116 through the circle-shaped conductive via 114e. Furthermore, the center of the oblong-shaped redistribution pads 114d is aligned with the center of the circle-shaped conductive via 114e and the center of the octagon-shaped under bump metallurgy 116. Similar to the metallization structure M illustrated in FIG. 13, the metallization structure illustrated in FIG. 17A and FIG. 17B may further include dielectric layers 112d and 112e. The oblong-shaped redistribution pads 114d is sandwiched between the dielectric layer 112d and the dielectric layer 112e. The circle-shaped conductive via 114e is embedded in the dielectric layer 112e and lands on the oblong-shaped redistribution pads 114d. Further, the octagon-shaped under bump metallurgy 116 covers a portion the dielectric layer 112e and the circle-shaped conductive via 114e.

Figure 17C:
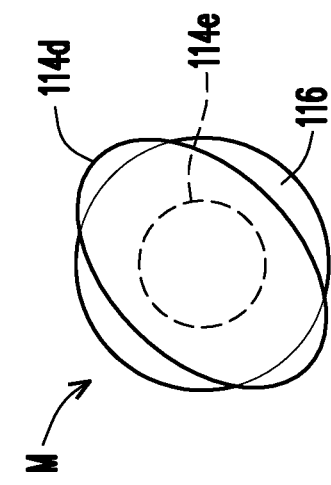

Referring to FIG. 17C, a metallization structure includes an elliptical-shaped redistribution pads 114d, a circle-shaped conductive via 114e, and a circle-shaped under bump metallurgy 116. The circle-shaped conductive via 114e is sandwiched between the elliptical-shaped redistribution pads 114d and the circle-shaped under bump metallurgy 116. The elliptical-shaped redistribution pads 114d is electrically connected to the circle-shaped under bump metallurgy 116 through the circle-shaped conductive via 114e. Furthermore, the center of the elliptical-shaped redistribution pads 114d is aligned with the center of the circle-shaped conductive via 114e and the center of the circle-shaped under bump metallurgy 116. Similar to the metallization structure M illustrated in FIG. 13, the metallization structure illustrated in FIG. 17C may further include dielectric layers 112d and 112e. The elliptical-shaped redistribution pads 114d is sandwiched between the dielectric layer 112d and the dielectric layer 112e. The circle-shaped conductive via 114e is embedded in the dielectric layer 112e and lands on the elliptical-shaped redistribution pads 114d. Further, the circle-shaped under bump metallurgy 116 covers a portion of the dielectric layer 112e and the circle-shaped conductive via 114e.

Referring to FIG. 17D, a metallization structure includes an oblong-shaped redistribution pads 114d, a circle-shaped conductive via 114e, and a circle-shaped under bump metallurgy 116. The oblong-shaped redistribution pad 114d includes a first pair of straight edges paralleled with long axis and a second pair of straight edges paralleled with short axis. The circle-shaped conductive via 114e is sandwiched between the oblong-shaped redistribution pads 114d and the circle-shaped under bump metallurgy 116. The oblong-shaped redistribution pads 114d is electrically connected to the circle-shaped under bump metallurgy 116 through the circle-shaped conductive via 114e. Furthermore, the center of the oblong-shaped redistribution pads 114d is aligned with the center of the circle-shaped conductive via 114e and the center of the circle-shaped under bump metallurgy 116. Similar to the metallization structure M illustrated in FIG. 13, the metallization structure illustrated in FIG. 17D may further include dielectric layers 112d and 112e. The oblong-shaped redistribution pads 114d is sandwiched between the dielectric layer 112d and the dielectric layer 112e. The circle-shaped conductive via 114e is embedded in the dielectric layer 112e and lands on the elliptical-shaped redistribution pads 114d. Further, the circle-shaped under bump metallurgy 116 covers a portion of the dielectric layer 112e and the circle-shaped conductive via 114e.

Figure 18:
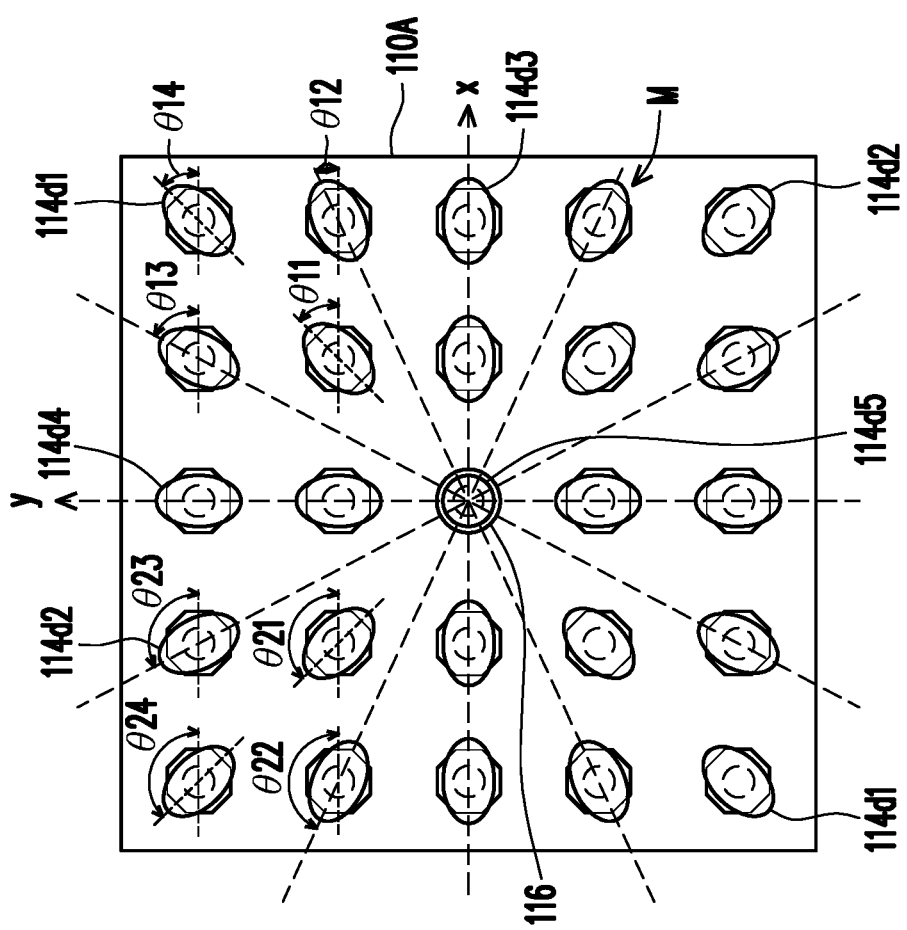
FIGS. 18 through 20 are bottom view schematically illustrating various arrangements of metallization structures in accordance with various embodiments of the present disclosure.
Figure 19:
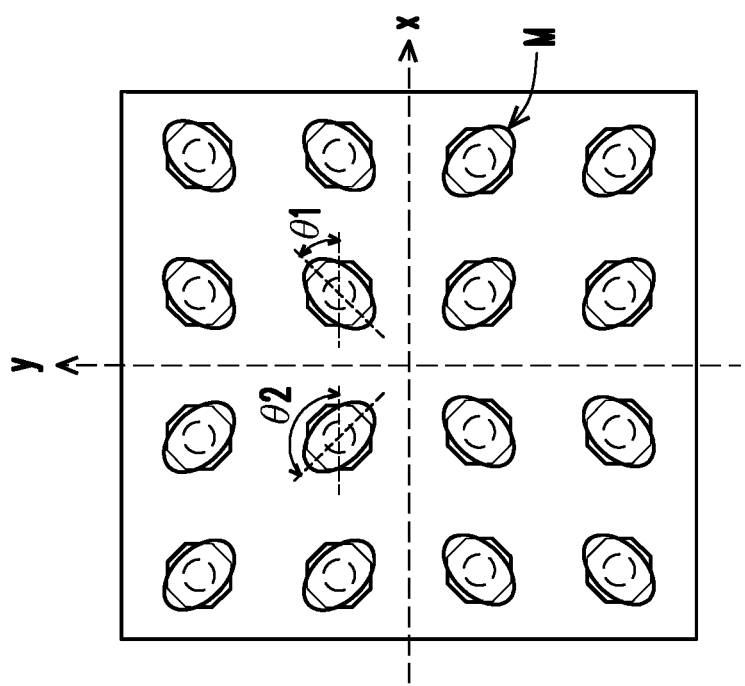
Figure 20:
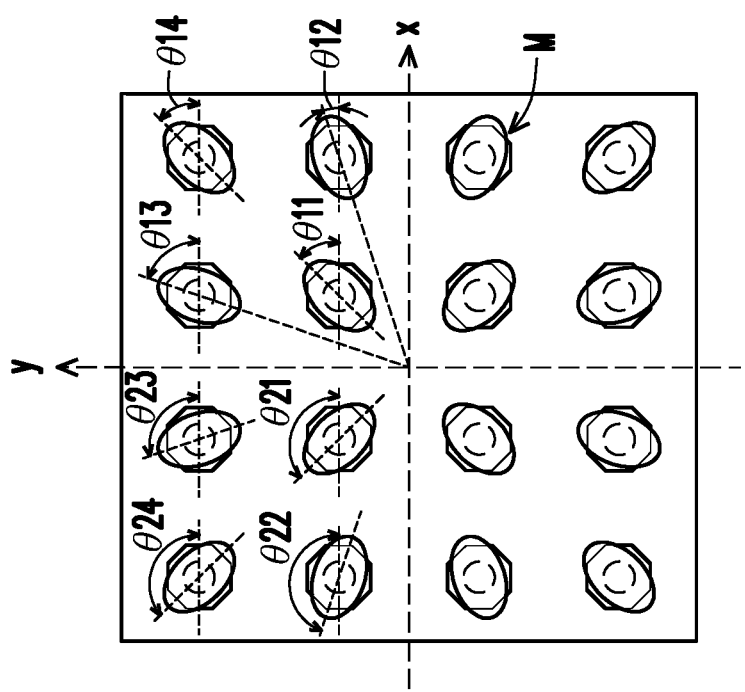

FIGS. 18 through 20 are bottom view schematically illustrating various arrangements of metallization structures in accordance with various embodiments of the present disclosure.

Referring to FIG. 16 and FIG. 18, the arrangement of metallization structures illustrated in FIG. 18 is similar to the arrangement of metallization structures illustrated in FIG. 16 except that long axes of all the elliptical-shaped redistribution pads 114d1, 114d2, 114d3, and 114d4 extend to pass through the center of the die bonding area 110A. As illustrated in FIG. 18, the elliptical-shaped redistribution pads 114d1 located on quadrant I and quadrant III have respective orientations. For example, long axes of the elliptical-shaped redistribution pads 114d1 located on quadrant I and quadrant III are not parallel with each other. In some embodiments, long axes of the elliptical-shaped redistribution pads 114d2 located on quadrant II and quadrant IV are not parallel with each other, and the long axes of the elliptical-shaped redistribution pads 114d1 are different from the second long axes of the elliptical-shaped redistribution pads 114d2. Included angles θ11, θ12, θ13, and θ14 between long axis of the elliptical-shaped redistribution pads 114d1 located in quadrant I and quadrant III and x-axis of Cartesian coordinate may be between 0° and 90°. Included angles θ21, θ22, θ23, and θ24 between long axis of the elliptical-shaped redistribution pads 114d2 located in quadrant II and quadrant IV and x-axis of Cartesian coordinate may be between 90° and 180°. In some embodiments, the long axes of the elliptical-shaped redistribution pads 114d3 located on x-axis are substantially parallel with x-axis. In other words, an included angle θ3 between long axis of each of the elliptical-shaped redistribution pads 114d3 and x-axis of Cartesian coordinate is 90°. In some embodiments, the long axes of the elliptical-shaped redistribution pads 114d4 located on y-axis are substantially parallel with y-axis.

Other types of metallization structures, such metallization structures illustrated in FIG. 17A through 17D, may be used in the arrangement shown in FIG. 18.

Referring to FIG. 16 and FIG. 19, the arrangement of metallization structures M illustrated in FIG. 19 is similar to the arrangement of metallization structures M illustrated in FIG. 16 except that no metallization structure illustrated in FIG. 19 is located on x-axis and y-axis. As illustrated FIG. 19, all metallization structures M are located on quadrant I, quadrant II, quadrant II, and quadrant IV. The details of the metallization structures M are the same as those illustrated in FIG. 16, and the detailed descriptions of the metallization structures M are thus omitted. Other types of metallization structures, such metallization structures M illustrated in FIG. 17A through 17D, may be used in the arrangement shown in FIG. 19.

Referring to FIG. 18 and FIG. 20, the arrangement of metallization structures M illustrated in FIG. 20 is similar to the arrangement of metallization structures M illustrated in FIG. 18 except that no metallization structure illustrated in FIG. 20 is located on x-axis and y-axis. As illustrated FIG.

20, all metallization structures M are located on quadrant I, quadrant II, quadrant II, and quadrant IV. The details of the metallization structures M are the same as those illustrated in FIG. 18, and the detailed descriptions of the metallization structures M are thus omitted. Other types of metallization structures, such metallization structures M illustrated in FIG. 17A through 17D, may be used in the arrangement shown in FIG. 20.

In the above-mentioned embodiments, the elliptical-shaped or oblong-shaped redistribution pads design in metallization structures can reduce stress issue resulted from CTE mismatch. Accordingly, yield rate and reliability of package structures including the elliptical-shaped or oblong-shaped redistribution pads design can be enhanced.

In accordance with some embodiments of the disclosure, a metallization structure electrically connected to a conductive bump is provided. The metallization structure includes an oblong-shaped redistribution pad, a conductive via disposed on the oblong-shaped redistribution pad, and an under bump metallurgy (UBM) covering the conductive via, wherein the conductive bump is disposed on the UBM. In some embodiments, a center of the oblong-shaped redistribution pad is substantially aligned with a center of the UBM. In some embodiments, the UBM includes a circle-shaped UBM, A1 is a diameter of circle-shaped UBM, B1 is a length of the oblong-shaped redistribution pad in short axis, B2 is a length of the oblong-shaped redistribution pad in long axis, C is a diameter of conductive via, and A1, B1, B2 and C satisfy the following inequality (1): $B2>A1 \geq B1 \geq C$ ... (1). In some embodiments, A1 and C satisfy the following inequality (2): $6.4 \geq A1/C \geq 1.5$ ... (2). In some embodiments, A1, B1, and B2 satisfy the following inequalities (3)~(5): $1 \geq B1/A1 \geq 0.6$ ... (3); $3 \geq B2/A1 > 1$ ... (4); and $3 \geq B2/B1 > 1$ ... (5). In some embodiments, the UBM comprises an octagon-shaped UBM, A2 is a distance between a pair of opposite sides of the octagon-shaped UBM, B1 is a length of the oblong-shaped redistribution pad in short axis, B2 is a length of the oblong-shaped redistribution pad in long axis, C is a diameter of conductive via, and A2, B1, B2 and C satisfy the following inequality (1): $B2>A2 \geq B1>C$ ... (1). In some embodiments, A2 and C satisfy the following inequality (2): $6.4 \geq A2/C \geq 1.5$ ... (2). In some embodiments, A2, B1, and B2 satisfy the following inequalities (3)~(5): $1 \geq B1/A2 \geq 0.6$ ... (3); $3 \geq B2/A2 > 1$ ... (4); and $3 \geq B2/B1 > 1$ ... (5). In some embodiments, the metallization structure further includes a first dielectric layer; and a second dielectric layer disposed on the first dielectric layer and covering the oblong-shaped redistribution pad, wherein the oblong-shaped redistribution pad is disposed on the first dielectric layer, the conductive via is embedded in the second dielectric layer, and the UBM is disposed on the second dielectric layer.

In accordance with some other embodiments of the disclosure, a package structure including a redistribution circuit structure, first conductive bumps, and a semiconductor die is provided. The redistribution circuit structure includes first metallization structures, each of the first metallization structures respectively includes an oblong-shaped redistribution pad, a dielectric layer, a conductive via, and an under bump metallurgy (UBM). The oblong-shaped redistribution pad is disposed on the first dielectric layer. The dielectric layer covers the oblong-shaped redistribution pad. The conductive via is embedded in the dielectric layer and disposed on the oblong-shaped redistribution pad. The under bump metallurgy (UBM) is disposed on the dielectric layer and covers the conductive via. The first conductive bumps are disposed on the UBMs of the first metallization structures. The semiconductor die is disposed on the redistribution circuit structure and includes second conductive bumps electrically connected to the first conductive bumps, wherein a die bonding area of the redistribution circuit structure covered by the semiconductor die is categorized into quadrants I, II, II, and IV by Cartesian coordinate with a center of the die bonding area as origin. An included angle between long axis of each of the oblong-shaped redistribution pads located in quadrant I and quadrant III and x-axis of Cartesian coordinate is between 0° and 90°. An included angle between long axis of each of the oblong-shaped redistribution pads located in quadrant II and quadrant IV and x-axis of Cartesian coordinate is between 90° and 180°. In some embodiments, long axis of each of the oblong-shaped redistribution pads located on x-axis of Cartesian coordinate is substantially parallel with x-axis. In some embodiments, long axis of each of the oblong-shaped redistribution pads located on y-axis of Cartesian coordinate is substantially parallel with y-axis. In some embodiments, the redistribution circuit structure further includes a second metallization structure located at the center of the die bonding area, the second metallization structure includes a central redistribution pad, and the central redistribution pad is smaller than the UBM. In some embodiments, long axes of the oblong-shaped redistribution pads extend to pass through the center of the die bonding area. In some embodiments, the package structure further includes a package substrate, conductive terminals, and an underfill. The conductive terminals are disposed between the package substrate and the redistribution circuit structure, wherein the redistribution circuit structure is electrically connected to the package substrate through the conductive terminals. The underfill is disposed between the package substrate and the redistribution circuit structure, and the underfill laterally encapsulates the conductive terminals.

In accordance with some other embodiments of the disclosure, a package structure including a redistribution circuit structure, first conductive bumps, and a semiconductor die is provided. The redistribution circuit structure includes first metallization structures arranged in array, each of the first metallization structures respectively includes an oblong-shaped redistribution pad disposed on the first dielectric layer; a dielectric layer covering the oblong-shaped redistribution pad; a conductive via embedded in the dielectric layer and disposed on the oblong-shaped redistribution pad; and an under bump metallurgy (UBM) disposed on the dielectric layer and covering the conductive via. The first conductive bumps are disposed on the UBMs of the first metallization structures. The semiconductor die is disposed on the redistribution circuit structure and includes second conductive bumps electrically connected to the first conductive bumps. A die bonding area of the redistribution circuit structure covered by the semiconductor die is categorized into quadrants I, II, II, and IV by Cartesian coordinate with a center of the die bonding area as origin. A first orientation of the oblong-shaped redistribution pads located on quadrant I and quadrant III is different a second orientation of oblong-shaped redistribution pads located on quadrant II and quadrant IV. In some embodiments, first long axes of the oblong-shaped redistribution pads located on quadrant I and quadrant III are substantially parallel with each other. In some embodiments, second long axes of the oblong-shaped redistribution pads located on quadrant II and quadrant IV are substantially parallel with each other, and the first long axes are different from the second long axes. In some embodiments, long axes of the oblong-shaped redistribution pads located on x-axis are substantially parallel with x-axis. In some embodiments, long axes of the oblong-shaped redistribution pads located on y-axis are substantially parallel with y-axis. In some embodiments, the redistribution circuit structure further includes a second metallization structure located at the center of the die bonding area, the second metallization structure includes a central redistribution pad, and the central redistribution pad is smaller than the UBM a.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package structure, comprising:
a redistribution circuit structure comprising first metallization structures, each of the first metallization structures respectively comprising:
an oblong-shaped or elliptical-shaped redistribution pad;
a dielectric layer covering the oblong-shaped or elliptical-shaped redistribution pad;
a conductive via embedded in the dielectric layer and disposed on the oblong-shaped or elliptical-shaped redistribution pad;
an under bump metallurgy (UBM) disposed on the dielectric layer and covering the conductive via;
first conductive bumps disposed on the UBMs of the first metallization structures;
a semiconductor die disposed on the redistribution circuit structure and comprising second conductive bumps electrically connected to the first conductive bumps, wherein a die bonding area of the redistribution circuit structure covered by the semiconductor die is categorized into quadrants I, II, II, and IV by Cartesian coordinate with a center of the die bonding area as origin, wherein
an included angle between long axis of each of the oblong-shaped or elliptical-shaped redistribution pads located in quadrant I and quadrant III and x-axis of Cartesian coordinate is between 0° and 90°,
an included angle between long axis of each of the oblong-shaped or elliptical-shaped redistribution pads located in quadrant II and quadrant IV and x-axis of Cartesian coordinate is between 90° and 180°.

2. The package structure of claim 1, wherein long axis of each of the oblong-shaped or elliptical-shaped redistribution pads located on x-axis of Cartesian coordinate is substantially parallel with x-axis.

3. The package structure of claim 1, wherein long axis of each of the oblong-shaped or elliptical-shaped redistribution pads located on y-axis of Cartesian coordinate is substantially parallel with y-axis.

4. The package structure of claim 1, wherein the redistribution circuit structure further comprises a second metallization structure located at the center of the die bonding area, the second metallization structure comprises a central redistribution pad, and the central redistribution pad is smaller than the UBM.

5. The package structure of claim 1, wherein long axes of the oblong-shaped or elliptical-shaped redistribution pads extend to pass through the center of the die bonding area.

6. The package structure of claim 1 further comprising:
a package substrate;
conductive terminals disposed between the package substrate and the redistribution circuit structure, wherein the redistribution circuit structure is electrically connected to the package substrate through the conductive terminals; and
an underfill disposed between the package substrate and the redistribution circuit structure, wherein the underfill laterally encapsulates the conductive terminals.

7. A package structure, comprising:
a redistribution circuit structure comprising first metallization structures, each of the first metallization structures respectively comprising:
an oblong-shaped or elliptical-shaped redistribution pad disposed on the first dielectric layer;
a dielectric layer covering the oblong-shaped or elliptical-shaped redistribution pad;
a conductive via embedded in the dielectric layer and disposed on the oblong-shaped or elliptical-shaped redistribution pad;
an under bump metallurgy (UBM) disposed on the dielectric layer and covering the conductive via;
first conductive bumps disposed on the UBMs of the first metallization structures;
a semiconductor die disposed on the redistribution circuit structure and comprising second conductive bumps electrically connected to the first conductive bumps, wherein a die bonding area of the redistribution circuit structure covered by the semiconductor die is categorized into quadrants I, II, II, and IV by Cartesian coordinate with a center of the die bonding area as origin, wherein
a first orientation of the oblong-shaped or elliptical-shaped redistribution pads located on quadrant I and quadrant III is different a second orientation of oblong-shaped or elliptical-shaped redistribution pads located on quadrant II and quadrant IV.

8. The package structure of claim 7, wherein first long axes of the oblong-shaped or elliptical-shaped redistribution pads located on quadrant I and quadrant III are substantially parallel with each other,
second long axes of the oblong-shaped or elliptical-shaped redistribution pads located on quadrant II and quadrant IV are substantially parallel with each other, and the first long axes are different from the second long axes.

9. The package structure of claim 8, wherein long axes of the oblong-shaped or elliptical-shaped redistribution pads located on x-axis are substantially parallel with x-axis.

10. The package structure of claim 8, wherein long axes of the oblong-shaped or elliptical-shaped redistribution pads located on y-axis are substantially parallel with y-axis.

11. The package structure of claim 8, wherein the redistribution circuit structure further comprises a second metallization structure located at the center of the die bonding area, the second metallization structure comprises a central redistribution pad, and the central redistribution pad is smaller than the UBM.

12. A package structure, comprising:
a redistribution circuit structure comprising first metallization structures, each of the first metallization structures respectively comprising:

an oblong-shaped or elliptical-shaped redistribution pad;
a dielectric layer covering the oblong-shaped or elliptical-shaped redistribution pad;
a conductive via embedded in the dielectric layer and disposed on the oblong-shaped or elliptical-shaped redistribution pad;
an under bump metallurgy (UBM) disposed on the dielectric layer and covering the conductive via;
first conductive bumps disposed on the UBMs of the first metallization structures;
a semiconductor die disposed on the redistribution circuit structure and comprising second conductive bumps electrically connected to the first conductive bumps, wherein a die bonding area of the redistribution circuit structure covered by the semiconductor die is categorized into quadrants I, II, II, and IV by Cartesian coordinate with a center of the die bonding area as origin, wherein an included angle between long axis of each of the oblong-shaped or elliptical-shaped redistribution pads located in quadrant I and quadrant III and x-axis of Cartesian coordinate is between 0° and 90°,
an included angle between long axis of each of the oblong-shaped or elliptical-shaped redistribution pads located in quadrant II and quadrant IV and x-axis of Cartesian coordinate is between 90° and 180°,
third conductive bumps disposed on the redistribution circuit structure, the third conductive bumps and the second conductive bumps being respectively disposed at opposite surfaces of the redistribution circuit structure, and the oblong-shaped or elliptical-shaped redistribution pad is not physically in contact with the third conductive bumps.

13. The package structure of claim 12, wherein long axes of the oblong-shaped or elliptical-shaped redistribution pads extend to pass through the center of the die bonding area.

14. The package structure of claim 12 further comprising:
a package substrate;
conductive terminals disposed between the package substrate and the redistribution circuit structure, wherein the redistribution circuit structure is electrically connected to the package substrate through the conductive terminals; and
an underfill disposed between the package substrate and the redistribution circuit structure, wherein the underfill laterally encapsulates the conductive terminals.

15. The package structure of claim 12, wherein the UBM comprises a circle-shaped UBM, A1 is a diameter of circle-shaped UBM, B1 is a length of the oblong-shaped or elliptical-shaped redistribution pad in short axis, B2 is a length of the oblong-shaped or elliptical-shaped redistribution pad in long axis, C is a diameter of conductive via, and A1, B1, B2 and C satisfy the following inequality (1):

$$B2 > A1 \geq B1 > C \qquad (1).$$

16. The package structure of claim 15, wherein A1 and C satisfy the following inequality (2):

$$6.4 \geq A1/C \geq 1.5 \qquad (2).$$

17. The package structure of claim 15, wherein A1, B1, and B2 satisfy the following inequalities (3)~(5):

$$1 \geq B1/A1 \geq 0.6 \qquad (3);$$

$$3 \geq B2/A1 > 1 \qquad (4); \text{ and}$$

$$3 \geq B2/B1 > 1 \qquad (5).$$

18. The package structure of claim 12, wherein the UBM comprises an octagon-shaped UBM, A2 is a distance between a pair of opposite sides of the octagon-shaped UBM, B1 is a length of the oblong-shaped or elliptical-shaped redistribution pad in short axis, B2 is a length of the oblong-shaped or elliptical-shaped redistribution pad in long axis, C is a diameter of conductive via, and A2, B1, B2 and C satisfy the following inequality (1):

$$B2 > A1 \geq B1 > C \qquad (1).$$

19. The package structure of claim 18, wherein A2 and C satisfy the following inequality (2):

$$6.4 \geq A1/C \geq 1.5 \qquad (2).$$

20. The package structure of claim 18, wherein A2, B1, and B2 satisfy the following inequalities (3)~(5):

$$1 \geq B1/A1 \geq 0.6 \qquad (3);$$

$$3 \geq B2/A1 > 1 \qquad (4); \text{ and}$$

$$3 \geq B2/B1 > 1 \qquad (5).$$

* * * * *